United States Patent
Wang et al.

(10) Patent No.: US 7,561,205 B2
(45) Date of Patent: Jul. 14, 2009

(54) APPARATUS AND METHOD FOR ADJUSTING A PIXEL CLOCK FREQUENCY BASED ON A PHASE LOCKED LOOP

(75) Inventors: Jian-Feng Wang, Guangdong (CN); Jian-Jun Zhu, Guangdong (CN); Liang-Yan Dai, Guangdong (CN)

(73) Assignees: Hong Fu Jin Precision Industry (Shen Zhen) Co., Ltd., Longhua Town, Bao'an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 755 days.

(21) Appl. No.: 11/306,444

(22) Filed: Dec. 28, 2005

(65) Prior Publication Data

US 2006/0197869 A1    Sep. 7, 2006

(30) Foreign Application Priority Data

Dec. 30, 2004    (CN)    ............................ 200410091959

(51) Int. Cl.
*H04N 5/06*    (2006.01)
(52) U.S. Cl. ...................................... 348/537; 348/521
(58) Field of Classification Search ................. 348/536, 348/537, 540, 521, 524; 375/353, 373, 375, 375/376; 327/147, 151, 156, 160; *H04N 5/06, H04N 5/04*
See application file for complete search history.

(56) References Cited

U.S. PATENT DOCUMENTS

| 6,396,486 | B1 | 5/2002 | Kuo et al. |
| 6,448,996 | B2 | 9/2002 | Suganuma |
| 7,002,634 | B2 * | 2/2006 | Tai et al. ...................... 348/537 |
| 7,327,401 | B2 * | 2/2008 | Choi et al. ................... 348/536 |

* cited by examiner

*Primary Examiner*—Sherrie Hsia
(74) *Attorney, Agent, or Firm*—Winston Hsu

(57) ABSTRACT

An apparatus for adjusting a pixel clock frequency based on a phase locked loop (PLL) includes: a pixel clock generator (11) for generating an actual pixel clock having an actual frequency; a division frequency counter (12) for dividing the actual pixel clock into several pixel clocks having different frequency ranges by means of multiplying the actual frequency of the actual pixel clock by a multiplier; a reference frequency counter (13) for dividing the actual pixel clock by means of lowering the actual frequency of the actual pixel clock, and generating a reference frequency; a reactive frequency counter (14) for dividing the actual pixel clock by means of heightening the actual frequency of the actual pixel clock, and generating a reactive frequency; a PLL circuit (16) for integrating the reference frequency and the reactive frequency to generate a required pixel clock having a required frequency. A related method is also disclosed.

12 Claims, 4 Drawing Sheets

| S | $2^S$ | Frequency Ranges |
|---|---|---|
| 0 | 1 | 20 MHz ~ 50MHz |
| 1 | 2 | 40 MHz ~ 100MHz |
| 2 | 4 | 80MHz ~ 200MHz |
| 3 | 8 | 160MHz ~ 400MHz |
| ...... | ...... | ...... |

FIG. 4

APPARATUS AND METHOD FOR ADJUSTING A PIXEL CLOCK FREQUENCY BASED ON A PHASE LOCKED LOOP

FIELD OF THE INVENTION

The present invention generally relates to the field of generating a pixel clock, and more particularly to an apparatus and method for adjusting a pixel clock frequency based on a phase locked loop.

DESCRIPTION OF RELATED ART

Conventionally, a horizontal synchronization signal is used in a television and a video display stated by a video electronic standards association specification. The horizontal synchronization signal is usually generated according to a pixel clock which is generated by a pixel clock generator. Generally, The pixel clock generator generates an actual pixel clock having an actual frequency, and inputs the actual pixel clock to a phase locked loop (PLL) circuit. The PLL circuit typically comprises a control port for receiving a multiplier, an input port for receiving the actual pixel clock, and an output port for generating the horizontal synchronization signal. As well known, a traditional PLL circuit generates the actual pixel clock which frequency is typically between 20 MHz and 50 MHz. However, a frequency of a horizontal synchronization signal (i.e. 100 MHz and 300 MHz) for a video display often exceeds the actual frequency range. Thus, the PLL circuit affects the ability to produce a required pixel clock for the video display because of the limited frequency range.

Generally, frequencies of the horizontal synchronization signal are neither instantaneous nor well defined with respect to the frequency of the pixel clock used to generate a video signal. Accordingly, users of such a video display must manually adjust the frequency of the pixel clock for the video display to match the frequency of the video input signal in order to produce a required image. This manual adjustment is an annoying nuisance for the video display users. More importantly, if multiple video sources are being used, manual adjustment requirements become a severe inefficiency problem resulting in decreased productivity.

What is needed, therefore, is an apparatus for adjusting a pixel clock frequency based on a phase locked loop, which can automatically adjust the frequency of a pixel clock of a video display to match different frequencies for incoming video signals.

Similarly, what is also needed is a method for adjusting a pixel clock frequency based on a phase locked loop, which can automatically adjust the frequency of a pixel clock of a video display to match different frequencies for incoming video signals.

SUMMARY OF INVENTION

An apparatus for adjusting a pixel clock frequency based on a phase locked loop (PLL) in accordance with a preferred embodiment which can generate an adjustable horizontal synchronization signal according to a required pixel clock generated by the PLL. The apparatus includes an input device, a pixel clock generator, a division frequency counter, a reference frequency counter, a reactive frequency counter, a micro-programmed control unit (MCU), a PLL circuit, and a horizontal synchronization signal generator.

The input device is used for inputting a frequency expectation by a user. The pixel clock generator is used for generating an actual pixel clock having an actual frequency. The division frequency counter is used for dividing the actual pixel clock into several pixel clocks having different frequency ranges by means of multiplying the actual frequency of the actual pixel clock by a multiplier. The reference frequency counter is used for dividing the actual pixel clock by means of lowering the actual frequency of the actual pixel clock, and generating a reference frequency. The reactive frequency counter is used for dividing the actual pixel clock by means of heightening the actual frequency of the actual pixel clock, and generating a reactive frequency. The MCU is used for executing corresponding instructions and generating a respective value to control the division frequency counter, the reference frequency counter and the reactive frequency counter respectively. The PLL circuit is used for integrating the reference frequency and the reactive frequency to generate the required pixel clock having a required frequency. The horizontal synchronization signal generator is used for generating a horizontal synchronization signal according to the required pixel clock from the PLL circuit.

Another preferred embodiment provides an electronic method for adjusting a pixel clock frequency based on a phase locked loop by utilizing the above apparatus. The method includes the steps of: generating an actual pixel clock having an actual frequency $F_{in}$ from a pixel clock generator; calculating a value M for inputting a reactive frequency counter; calculating a value N for inputting a reference frequency counter; calculating a value S for inputting a division frequency counter; and generating a required pixel clock having a required frequency $F_{vco}$ by a PLL circuit according to a frequency conversion formula: $F_{vco}=F_{in}*(M/N)/2^S$.

The value M and the value N are calculated in accordance with the steps of: (a1) inputting a frequency expectation $F_{pix}$ by a signal input device; (a2) initializing a parameter P, and calculating $P=F_{pix}/F_{in}$; (a3) setting $M_{-2}=0$ and $N_{-2}=1$, and setting $M_{-1}=0$, $N_{-1}=0$, wherein $M_{-2}$ and $M_{-1}$ are recursive parameters of the value M, and $N_{-2}$ and $N_{-1}$ are recursive parameters of the value N; (a4) calculating $Z=[P]$ to get the integer part of P, and calculating $P=1/P$ to get the decimal part of P; (a5) calculating $M=M_{-1}*Z+M_{-2}$, $M_{-2}=M_{-1}$ and $M_{-1}=M$; (a6) calculating $N=N_{-1}*Z+N_{-2}$, $N_{-2}=N_{-1}$ and $N_{-1}=N$; (a7) determining whether an absolute value $((M/N)/P)-1$ is less than $10^{-5}$; and (a8) repeating the three calculating steps, if the absolute value $((M/N)/P)-1$ is not less than $10^{-5}$; or outputting the value M to the reactive frequency counter and the value N to the reference frequency counter, if the absolute value $((M/N)/P)-1$ is less than $10^{-5}$.

The value N is calculated in accordance with the steps of: (b1) setting j=0, wherein j is a count parameter; (b2) determining whether the frequency expectation $F_{pix}$ is between $2^j*F_{pllmin}$ and $2^j*F_{pllmax}$; (b3) calculating j=j+1, and repeating the determining step, if the frequency expectation $F_{pix}$ is not between $2^j*F_{pllmin}$ and $2^j*F_{pllmax}$; or setting the valve S as j, if the frequency expectation $F_{pix}$ is between $2^j*F_{pllmin}$ and $2^j*F_{pllmax}$; and (b4) outputting the value S to the division frequency counter. Wherein $F_{pllmin}$ is a minimum frequency of the pixel clock generated by the PLL circuit, and $F_{pllmax}$ is a maximum frequency of the pixel clock generated by the PLL circuit.

Other advantages and novel features of the embodiments will be drawn from the following detailed description with reference to the attached drawings, in which:

BRIEF DESCRIPTION OF DRAWINGS

FIG. 4 is a schematic diagram of different frequency ranges of a pixel clock according to different calculated values S.

DETAILED DESCRIPTION

Figure 1:
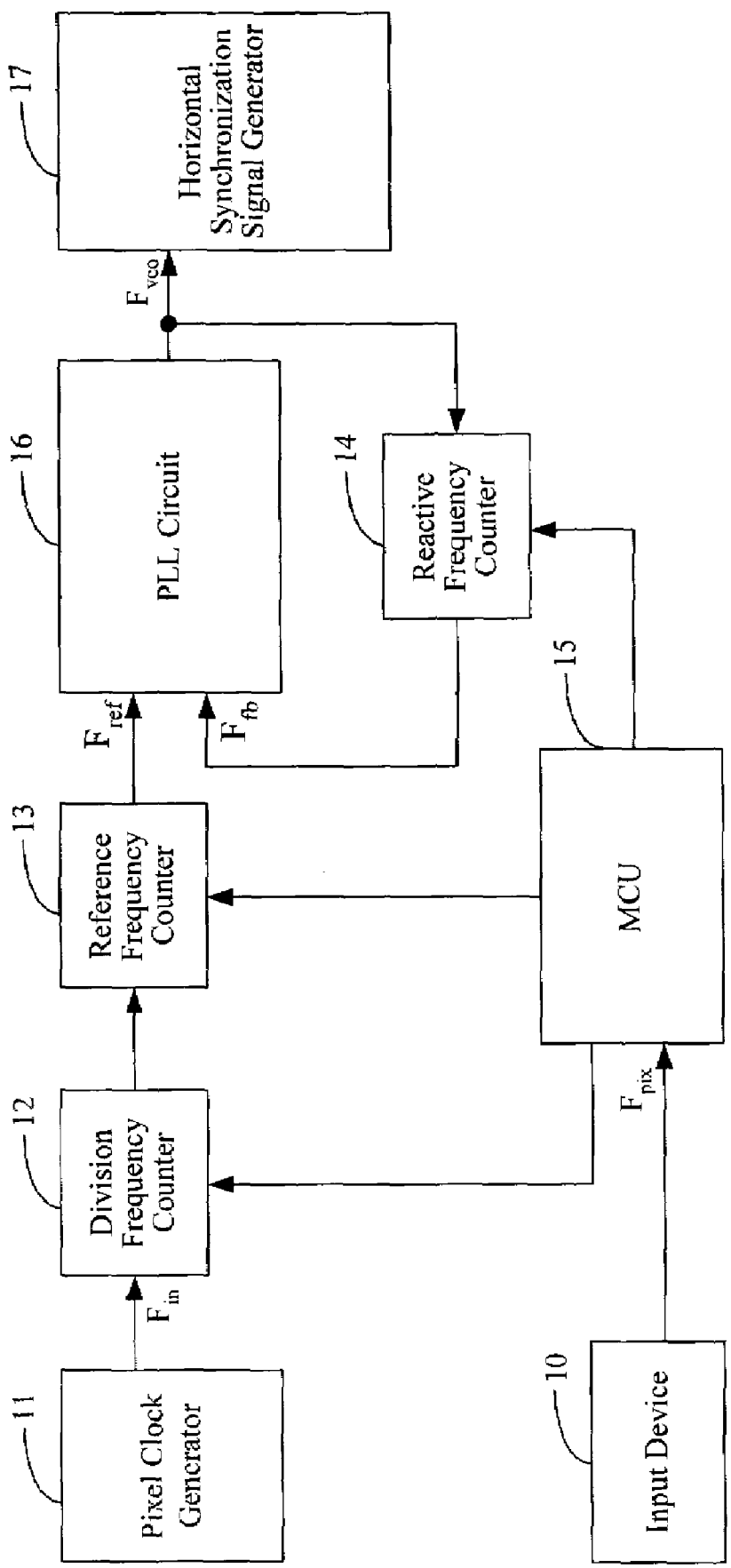
FIG. 1 is a schematic diagram of an apparatus for automatically adjusting a pixel clock based on a phase locked loop in accordance with a preferred embodiment.

FIG. 1 is a schematic diagram of an apparatus for automatically adjusting a pixel clock frequency based on a phase locked loop (hereinafter "the apparatus") in accordance with a preferred embodiment. The apparatus includes an input device 10, a pixel clock generator 11, a division frequency counter (also depicted as an S counter) 12, a reference frequency counter (also depicted as an N counter) 13, a reactive frequency counter (also depicted as an M counter) 14, a micro-programmed control unit (MCU) 15, a phase locked loop (PLL) circuit 16, and a horizontal synchronization signal generator 17.

The input device 10 is used for inputting a frequency expectation (symbolically depicted as $F_{pix}$) which is equal to a required frequency (symbolically depicted as $F_{vco}$) of a required pixel clock output from the PLL circuit 16 to the horizontal synchronization signal generator 17. The pixel clock generator 11 is used for generating an actual pixel clock having an actual frequency (symbolically depicted as $F_{in}$) according to the frequency expectation $F_{pix}$, wherein the actual frequency $F_{in}$ is typically between 20 MHz and 50 MHz. The actual pixel clock is different from the required pixel clock. The division frequency counter 12 is used for dividing the actual pixel clock into several pixel clocks having different frequency ranges by means of multiplying the actual pixel clock by a multiplier $2^S$, wherein S is a value generated by the MCU 15. The reference frequency counter 13 and the reactive frequency counter 14 in combination realize the frequency division of the actual pixel clock. Specifically, the reference frequency counter 13 divides the actual pixel clock by means of lowering the frequency of the actual pixel clock according to the required frequency, and generates a reference frequency (symbolically depicted as $F_{ref}$) sent to the PLL circuit 16. The reactive frequency counter 14 divides the actual pixel clock by means of heightening the frequency of the actual pixel clock, and generates a reactive frequency (symbolically depicted as $F_{fb}$) sent to the PLL circuit 16. The MCU 15 is used for executing corresponding instructions to control the division frequency counter 12, the reference frequency counter 13, and the reactive frequency counter 14, and for generating values (including S, N, and M) sent to the counters for computing the reference frequency and the reactive frequency. The PLL circuit 16 includes a reference frequency input port for receiving the reference frequency $F_{ref}$ from the reference frequency counter 13, a reactive frequency input port for receiving the reactive frequency $F_{fb}$ from the reactive frequency counter 14, and a pixel clock output port for outputting a required pixel clock having the required frequency $F_{vco}$ to the horizontal synchronization signal generator 17. That is, the PLL circuit 16 integrates the reference frequency $F_{ref}$ and the reactive frequency $F_{fb}$, in order to generate the required pixel clock. The horizontal synchronization signal generator 17 is used for generating a horizontal synchronization signal according to the required pixel clock from the PLL circuit 16.

In a preferred embodiment, the apparatus automatically generates a required pixel clock having a required frequency $F_{vco}$ for a video display by means of utilizing a frequency conversion formula: $F_{vco}=F_{in}*(M/N)/2^S$. In the formula, $F_{in}$ is an actual frequency of an actual pixel clock from the pixel clock generator 11. $F_{vco}$ is a required frequency of a required pixel clock output from the PLL circuit 16. M is a value generated by the MCU 15 and inputted to the reactive frequency counter 14. N is a value generated by the MCU 15 and inputted to the reference frequency counter 13. S is a value generated by the MCU 15 and inputted to the division frequency counter 12.

Figure 2:
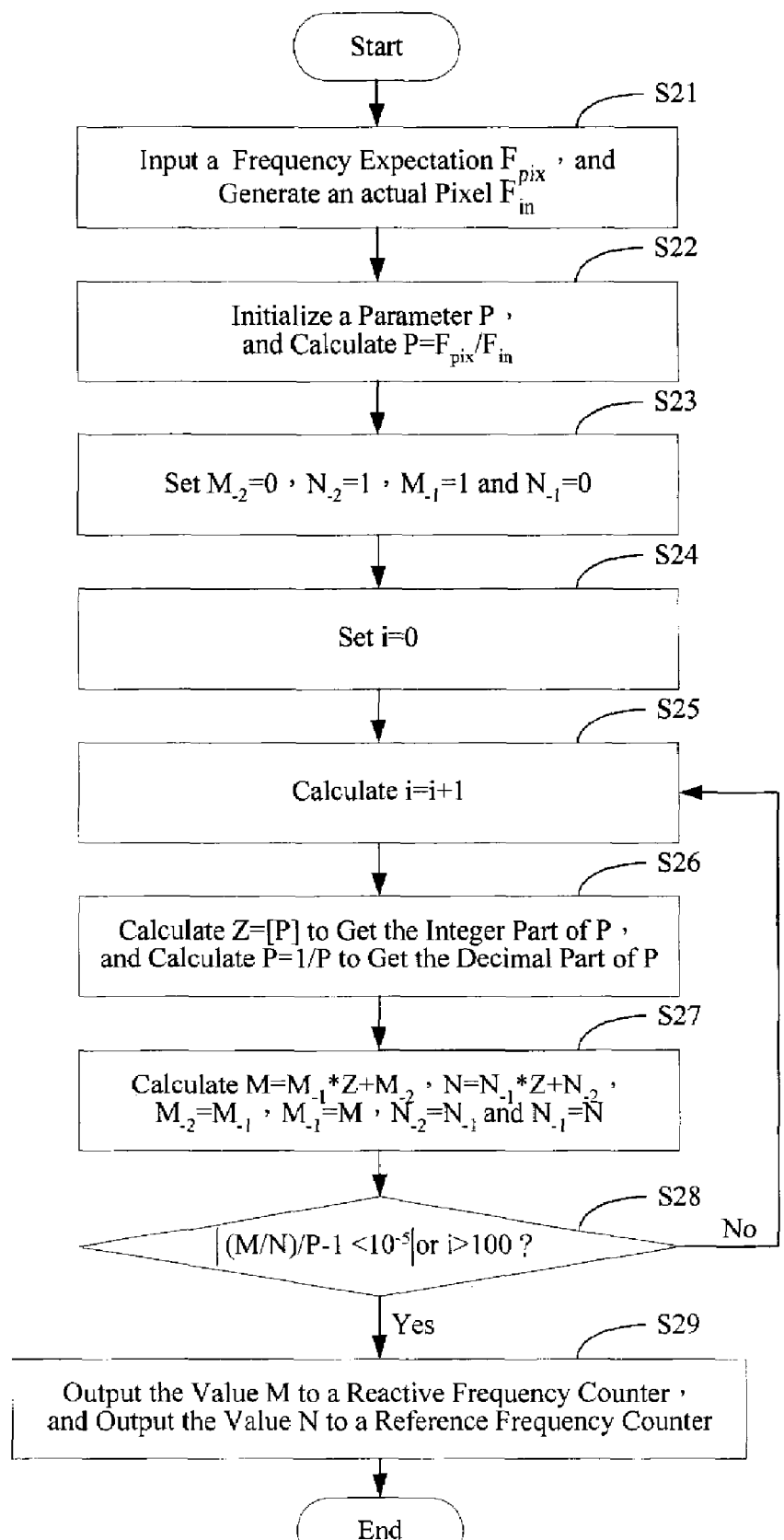
FIG. 2 is a flowchart of a preferred method for generating a value M of a reactive frequency counter and a value N of a reference frequency counter.

FIG. 2 is flowchart of a preferred method for generating a value M of the reactive frequency counter 14 and a value N of the reference frequency counter 13. In step S21, a user inputs a frequency expectation $F_{pix}$ by using the input device 10, and meanwhile, the pixel clock generator 11 generates an actual pixel clock having an actual frequency $F_{in}$. In step S22, the MCU 15 initializes a parameter P, and calculates the value of P according to a formula: $P=F_{pix}/F_{in}$. In step S23, the MCU 15 sets $M_{-2}=0$ and $N_{-2}=1$, and sets $M_{-1}=0$ and $N_{-1}=0$, wherein $M_{-2}$ and $M_{-1}$ are recursive parameters of the value M, and $N_{-2}$ and $N_{-1}$ are recursive parameters of the value N. In step S24, the MCU 15 sets a count parameter i=0. In step S25, the MCU 15 calculates the count parameter i=i+1. In step S26, the MCU 15 calculates Z=[P], in order to get the integer part of P. Then, the MCU 15 calculates P=1/P, in order to get the decimal part of P. In step S27, the MCU 15 calculates $M=M_{-1}*Z+M_{-2}$, $M_{-2}=M_{-1}$ and $M_{-1}=M$, and calculates $N=N_{-1}*Z+N_{-2}$, $N_{-2}=N_{-1}$ and $N_{-1}=N$. In step S28, the MCU 15 determines whether an absolute value ((M/N)/P)−1 is less than $10^{-5}$, or i is greater than 100. If the absolute value ((M/N)/P)−1 is less than $10^{-5}$ (that is |((M/N)/P)−1|<$10^{-5}$), or i is greater than 100 (that is i>100), in step S29, the MCU 15 outputs the value M to the reactive frequency counter 14, and outputs the value N to the reference frequency counter 13. Otherwise, if the absolute ((M/N)/P)−1 is not less than $10^{-5}$, and i is not greater than 100, the procedure returns to step S25 described above.

Figure 3:
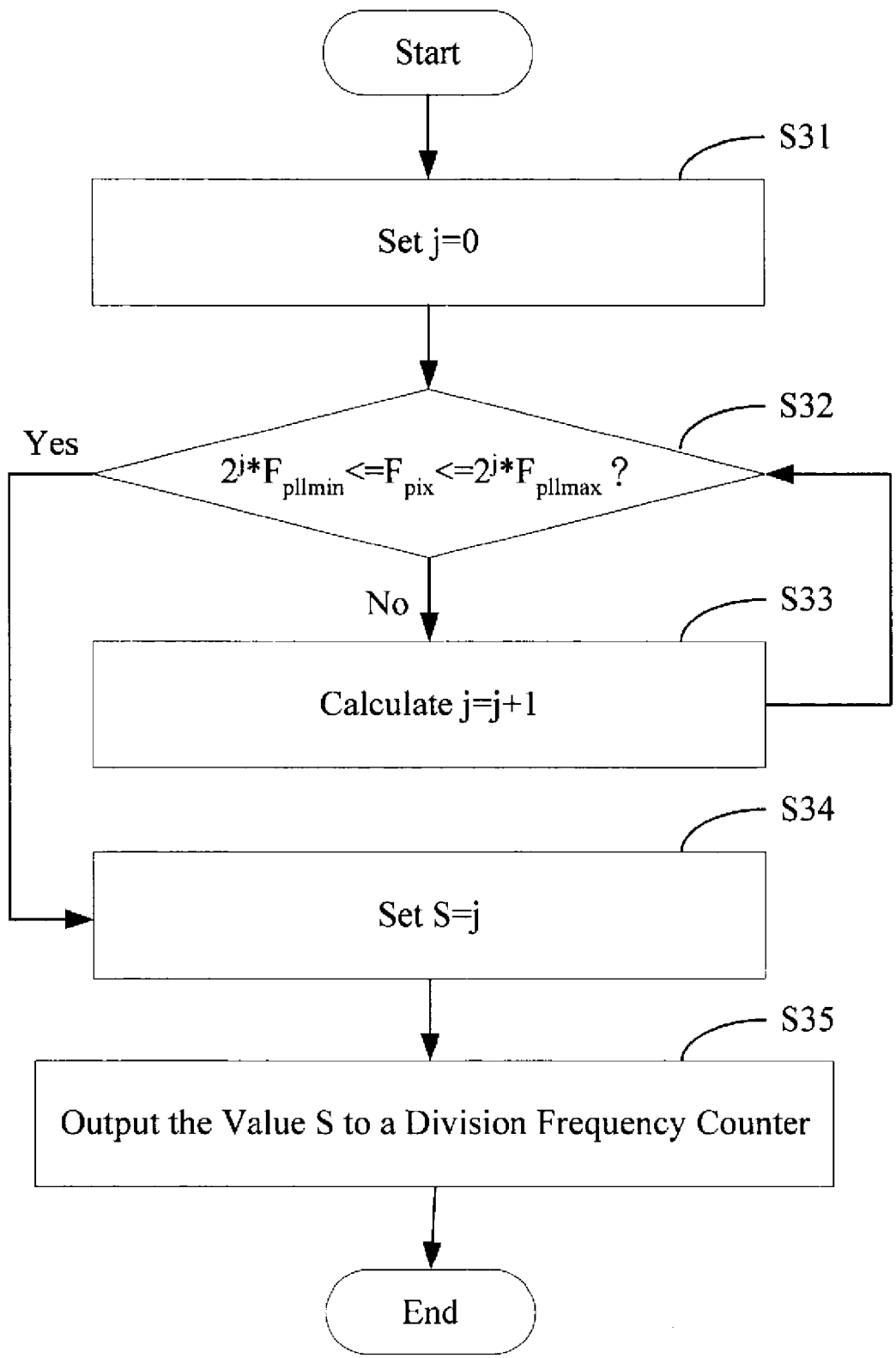
FIG. 3 is a flowchart of a preferred method for generating a value S of a division frequency counter.

FIG. 3 is a flowchart of a preferred method for generating a value S of the division frequency counter 12. In step S31, the MCU 15 sets a count parameter j=0. In step S32, the MCU 15 determines whether the frequency expectation $F_{pix}$ is between $2^j*F_{pllmin}$ and $2^j*F_{pllmax}$. $F_{pllmin}$ is a minimum frequency of a pixel clock generated by the PLL circuit 16, and $F_{pllmax}$ is a maximum frequency of a pixel clock generated by the PLL circuit 16. If the frequency expectation $F_{pix}$ is not between $2^j*F_{pllmin}$ and $2^j*F_{pllmax}$, in step S33, the MCU 15 calculates j=j+1, and the procedure returns to the step S32 described above. Otherwise, if the frequency expectation $F_{pix}$ is between $2^j*F_{pllmin}$ and $2^j*F_{pllmax}$, in step S34, the MCU 15 sets S=j. In step S35, the MCU 15 outputs the value S to the division frequency counter 12.

FIG. 4 is a schematic diagram of different frequency ranges of a horizontal synchronization signal according to different calculated values S. The PLL circuit 16 typically adjusts a pixel clock with a frequency between 20 MHz and 50 MHz. In a preferred embodiment, different frequency ranges of the horizontal synchronization signal are shown in FIG. 4 according to different calculated values S. The video electronic standards association specification defines that the bandwidth of a video signal is 8 bytes. Therefore, the frequency of horizontal synchronization signals may be exactly divided by the number $2^S$, such as 1, 2, 4, and 8.

According to the above-described apparatus and method, an example of adjusting a frequency of a pixel clock is shown and described below. It is assumed that a frequency 135 MHz of a horizontal synchronization signal is to be generated by the horizontal synchronization signal generator 17. Referring to FIG. 4, the frequency 135 MHz is in the third frequency range (80 MHz~200 MHz). Therefore, a frequency expectation 33.75 MHz can be calculated by dividing the frequency 135 MHz by $2^2=4$, wherein S=2. Then, the pixel clock generator 11 generates an actual pixel clock having an actual frequency $F_{in}$=48 MHz according to the frequency expectation. According to the method of FIG. 2, the MCU 15 calculates a value M=16, and inputs the value to the reactive frequency counter 14. Also, the MCU 15 calculates a value N=45, and inputs the value to the reference frequency counter 13. According to the method of FIG. 3, the MCU 15 calculates a value S=2, and inputs the value to the division frequency counter 12. The PLL circuit 16 generates a required pixel clock having a required frequency Fvco according to the aforementioned formula: $F_{vco}=F_{in}*(M/N)/2^S=F_{in}*(45/16)/2^2=48*(45/16)/2^2=33.75$ MHz, and outputs the required pixel clock to the horizontal synchronization signal generator 17. In conclusion, the horizontal synchronization signal generator 17 generates the horizontal synchronization signal having the frequency 135 MHz.

Although the present invention has been specifically described on the basis of a preferred embodiment and preferred method, the invention is not to be construed as being limited thereto. Various changes or modifications may be made to the embodiment and method without departing from the scope and spirit of the invention.

What is claimed is:

1. An apparatus for adjusting a pixel clock frequency based on a phase locked loop (PLL), the apparatus comprising:
   an input device for inputting a frequency expectation;
   a pixel clock generator for generating an actual pixel clock having an actual frequency according to the frequency expectation;
   a division frequency counter for dividing the actual pixel clock into several pixel clocks having different frequency ranges by means of multiplying the actual frequency of the actual pixel clock by a multiplier;
   a reference frequency counter for dividing the actual pixel clock by means of lowering the actual frequency of the actual pixel clock, and for generating a reference frequency;
   a reactive frequency counter for dividing the actual pixel clock by means of heightening the actual frequency of the actual pixel clock, and for generating a reactive frequency;
   a micro-programmed control unit (MCU) for executing corresponding instructions to control the division frequency counter, the reference frequency counter and the reactive frequency counter, and generating respective values sent to the counters for computing the reference frequency and the reactive frequency; and
   a PLL circuit for integrating the reference frequency and the reactive frequency to generate a required pixel clock having a required frequency.

2. The apparatus according to claim 1, wherein the multiplier is equal to $2^S$, wherein S is a value generated by the MCU and output to the division frequency counter.

3. The apparatus according to claim 1, further comprising a horizontal synchronization signal generator for generating a horizontal synchronization signal according to the required pixel clock output from the PLL circuit.

4. The apparatus according to claim 3, wherein the PLL circuit comprises a reference frequency input port for receiving the reference frequency from the reference frequency counter, a reactive frequency input port for receiving the reactive frequency from the reactive frequency counter, and a pixel clock output port for outputting the required pixel clock having the required frequency to the horizontal synchronization signal generator.

5. An electronic method for adjusting a pixel clock frequency based on a phase locked loop (PLL), the method comprising the steps of: generating an actual pixel clock having an actual frequency $F_{in}$ by a pixel clock generator; calculating a value M for inputting to a reactive frequency counter; calculating a value N for inputting to a reference frequency counter; calculating a value S for inputting to a division frequency counter; and generating a required pixel clock having a required frequency $F_{vco}$ by a PLL circuit according to a frequency conversion formula: $F_{vco}=F_{in}*(M/N)/2^S$.

6. The method according to claim 5, wherein the value M and the value N are calculated in accordance with the steps of:
   inputting a frequency expectation $F_{pix}$ from an input device;
   initializing a parameter P, and calculating $P=F_{pix}/F_{in}$;
   setting $M_{-2}=0$ and $N_{-2}=1$, and setting $M_{-1}=0$, $N_{-1}=0$;
   calculating Z=[P] to get the integer part of P, and calculating P=1/P to get the decimal part of P;
   calculating $M=M_{-1}*Z+M_{-2}$, $M_{-2}=M_{-1}$ and $M_{-1}=M$;
   calculating $N=N_{-1}*Z+N_{-2}$, $N_{-2}=N_{-1}$ and $N_{-1}=N$;
   determining whether an absolute value $((M/N)/P)-1$ is less than $10^{-5}$; and
   repeating the three calculating steps, if the absolute value $((M/N)/P)-1$ is not less than $10^{-5}$; or
   outputting the value M to the reactive frequency counter and the value N to the reference frequency counter, if the absolute value $((M/N)/P)-1$ is less than $10^{-5}$.

7. The method according to claim 6, wherein $M_{-2}$ and $M_{-1}$ are recursive parameters of the value M, and $N_{-2}$ and $N_{-1}$ are recursive parameters of the value N.

8. The method according to claim 5, wherein the value S is calculated in accordance with the steps of:
   setting j=0, wherein j is a count parameter;
   determining whether the frequency expectation $F_{pix}$ is between $2^j*F_{pllmin}$ and $2^j*F_{pllmax}$;
   calculating j=j+1, and repeating the determining step, if the frequency expectation $F_{pix}$ is not between $2^j*F_{pllmin}$ and $2^j*F_{pllmax}$; or
   setting S=j, if the frequency expectation $F_{pix}$ is between $2^j*F_{pllmin}$ and $2^j*F_{pllmax}$; and
   outputting the value S to the division frequency counter.

9. The method according to claim 8, wherein $F_{pllmin}$ is a minimum frequency of a pixel clock generated by the PLL circuit, and $F_{pllmax}$ is a maximum frequency of the pixel clock generated by the PLL circuit.

10. The method according to claim 5, further comprising the step of:
    generating a horizontal synchronization signal according to the required pixel clock.

11. An electronic method for adjusting a pixel clock frequency based on a phase locked loop (PLL), the method comprising the steps of:
    inputting a frequency expectation;
    generating an actual pixel clock having an actual frequency according to the frequency expectation;
    dividing the actual pixel clock into several pixel clocks having different frequency ranges;
    dividing the actual pixel clock by means of lowering the frequency of the actual pixel clock to generate a reference frequency;
    dividing the actual pixel clock by means of heightening the frequency of the actual pixel clock to generate a reactive frequency; and
    integrating the reference frequency and the reactive frequency to generate a required pixel clock having a required frequency.

12. The method according to claim 11, further comprising the step of:
    generating a horizontal synchronization signal according to the required pixel clock.

* * * * *